(12) United States Patent
Lee

(10) Patent No.: US 6,961,119 B2
(45) Date of Patent: Nov. 1, 2005

(54) METHOD AND APPARATUS TO FACILITATE SEPARATION OF A MASK AND A MASK PLATFORM

(75) Inventor: Sang Hun Lee, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 75 days.

(21) Appl. No.: 10/695,242

(22) Filed: Oct. 27, 2003

(65) Prior Publication Data

US 2005/0088639 A1 Apr. 28, 2005

(51) Int. Cl.⁷ .................. G03B 27/52; G03B 27/58; G03B 27/62
(52) U.S. Cl. .................. 355/75; 355/30; 355/72
(58) Field of Search .................. 355/30, 72, 75

(56) References Cited

U.S. PATENT DOCUMENTS 4,202,623 A * 5/1980 Watkin ..................... 355/30
6,653,639 B1 * 11/2003 Novak ..................... 250/491.1

* cited by examiner

*Primary Examiner*—Rodney Fuller
(74) *Attorney, Agent, or Firm*—Michael D. Plimier

(57) ABSTRACT

A method and apparatus to facilitate separation of a mask and mask platform is described. That method and apparatus comprises a temperature differential device that provides a temperature differential between a mask and a mask platform. The temperature differential facilitates separation of the mask and the mask platform.

32 Claims, 3 Drawing Sheets

METHOD AND APPARATUS TO FACILITATE SEPARATION OF A MASK AND A MASK PLATFORM

TECHNICAL FIELD

The invention generally relates to methods and apparatus for lithography, in particular, method and apparatus to facilitate separation of a mask and a mask platform in an extreme ultraviolet lithography environment.

BRIEF DESCRIPTION OF THE DRAWINGS

The various embodiments of the invention is illustrated by way of example and not by way of limitation in the figures of the accompanying drawings, in which the like references indicate similar elements and in which.

DETAILED DESCRIPTION

In various embodiments, a method and apparatus to facilitate separation of a mask and a mask platform are described. In the following description, various embodiments will be described. However, one skilled in the relevant art will recognize that the various embodiments may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1:
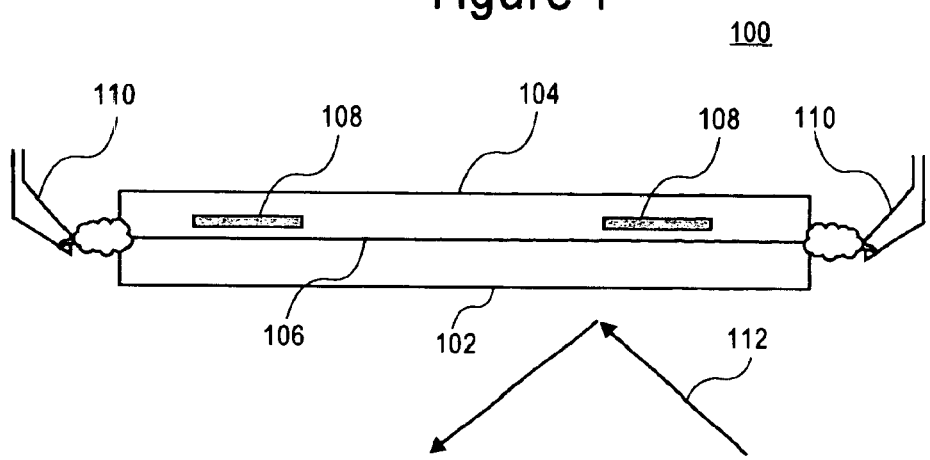
FIG. 1 illustrates a simplified side view of an apparatus, in accordance with one embodiment of the invention.

FIG. 1 illustrates a simplified side view of an apparatus, in accordance with one embodiment of the invention. In FIG. 1, an apparatus 100 includes a mask 102 and a mask platform 104. As shown, the mask 102 is disposed on the mask platform 104, and accordingly, between the mask 102 and the mask platform 104 is an interface 106. Additionally, shown in FIG. 1 are one or more electrical conductors 108 included within the mask platform 104. In the illustrated embodiment of FIG. 1, the apparatus 100 includes a temperature differential device 110.

In FIG. 1, the electrical conductors 108 may provide a predetermined holding force between the mask 102 and the mask platform 104 in the form of electrostatic forces between the mask 102 and the mask platform 104. In accordance with various embodiments of the invention, the predetermined holding force between the mask 102 and the mask platform 104 may be released by reversing the polarity of the of the electrostatic forces. In the embodiment illustrated in FIG. 1, once the predetermined holding force between the mask 102 and the mask platform 104 is released, the temperature differential device 110 provides a temperature differential at the interface 106 between the mask 102 and the mask platform 104, which in turn, facilitates separation of the mask 104 and the mask platform 102.

As shown in FIG. 1, the temperature differential device 110 may be a gas deliver device such as, but not limited to, a nozzle in accordance with one embodiment. The gas that is delivered to the interface 106 may be any type of gas such as, but not limited to, a low temperature gas. Further, the gas may be a noble gas that minimizes potential reactions with the various coatings and/or materials of the mask 102 and/or the mask platform 104 such as, but not limited to nitrogen.

In the illustrated embodiment of FIG. 1, the mask 102 and the mask platform 104 may be a mask and a mask platform compatible with use in extreme ultraviolet (EUV) radiation lithography environment. Accordingly, mask 102 and the mask platform 104 may be utilized in a high vacuum environment having a vacuum of approximately 10E−8 Torr or lower. As shown in FIG. 1, the mask platform 104 may be utilized to hold the mask 102 by electrostatic forces in the EUV environment. Accordingly, in the EUV radiation lithography environment, mask 102 may have various coatings such as, but not limited to, chromium to facilitate electrostatic forces. That is, the mask 102 may various coatings on the side facing the interface 106 to facilitate the holding forces between the mask 102 and the mask platform 104. In turn, the mask platform 104 may have various coatings such as, but not limited to, adhesive type coatings to facilitate stable coatings at the interface 106. In the EUV radiation lithography environment, relatively high holding forces may be utilized between the mask 102 and the mask platform 104 such as, but not limited to about 15 kPa (i.e., the mask platform 104 may exert a force upon the mask 102). Additionally, the EUV radiation may be radiation 112 from a radiation source (not shown) having wavelengths in the range of about 11–14 nm. As shown, the radiation 112 is commonly directed towards the mask 102.

The mask 102 and the mask platform 104 may be made of a material commonly utilized in EUV radiation lithography environments. For example, the mask 102 and the mask platform 104 may be made of low thermal expansion materials such as, but not limited to Zerodur™ provided by Schott Glass Corporation of Mainz, Germany and ULE™ provided by Corning Incorporated of New York, N.Y. Additionally, the mask 102 and the mask platform 104 may have various reflective type coatings commonly utilized in EUV radiation lithography environments such as, but not limited to, Molybdenum/Silicon (Mo/Si) multilayer (ML) reflective coatings to facilitate reflection of EUV radiation as shown in FIG. 1. The mask 102 may also have various EUV radiation absorbing coatings such as, but not limited to, titanium nitride, tantalum nitride, and any combination thereof, which may be disposed over the Mo/Si ML coatings, and various features may be patterned on the various EUV radiation absorbing material.

In various embodiments, the mask 102 and the mask platform 104 may be held together by predetermined holding forces in the form of electrostatic forces that may be substantial, as previously described. The electrodes 108 provide electrostatic holding forces. That is, the mask platform 104 may be provided with one electrical potential through the one or more electrodes 108 aids in holding the mask 102 onto the mask platform 104. As previously described, the mask 102, in particular at the interface 106, may have various coatings such as, but not limited to, electrically conductive coating such as Chromium (Cr) to facilitate substantial and stable holding forces. Accordingly, in order to release the mask 102 from the mask platform 104, the electrostatic holding forces may be released (i.e., remove pressure and provide a second electrical potential through the electrodes 108, which may be a reversal of an electrical potential to form a reverse force). However, the mask 102 and the mask platform 104 may not release in a timely manner, and this may be due to various surface tension affects which may be exacerbated by the various adhesive coatings on the mask interface 106, as previously described. That is, the surface tension may be relatively high due to substantially flat surfaces of the mask 102 and the mask platform 104 at the interface 106.

There may be various factors that affect the release of the mask 102 and the mask platform 104 (i.e., reasons why they continue to stick together even after the reverse force is applied). For example, when substantially flat surfaces are interfaced with each other for a period of time, the interface may have very small particles, air, or water that may be trapped resulting in very small vacuum like mechanisms. Further, the effects of these very small vacuum like mechanisms may be enhanced by the electrodes 108 within the mask platform 104. The addition of the various coatings may further to increase the sticking together of the mask 102 and the mask platform 104. Accordingly, in the one embodiment of FIG. 1, the temperature differential device 110 provides a temperature differential (e.g., a low temperature gas) at the interface 106 between the mask 102 and the mask platform 104 to facilitate separation of the mask 102 and the mask platform 104.

In FIG. 1, two thermal differential devices 110 are shown. However, it should be appreciated by those skilled in the relevant art that the number of thermal differential devices may be any number and of varying configurations to provide a thermal differential to the interface 106 between the mask 102 and the mask platform 104. Application of the thermal differential devices 110 in proximity to the interface 106 between the mask 102 and the mask platform 104 facilitates separation of the mask 102 and the mask platform 104 due to various thermal effects on the various adhesive mechanisms, as previously described. For example, thermal effects of contractions and/or embrittlement of the various coatings and the vacuum like mechanisms helps to reduce the sticking together of the mask 102 and the mask platform 104.

Figure 2:
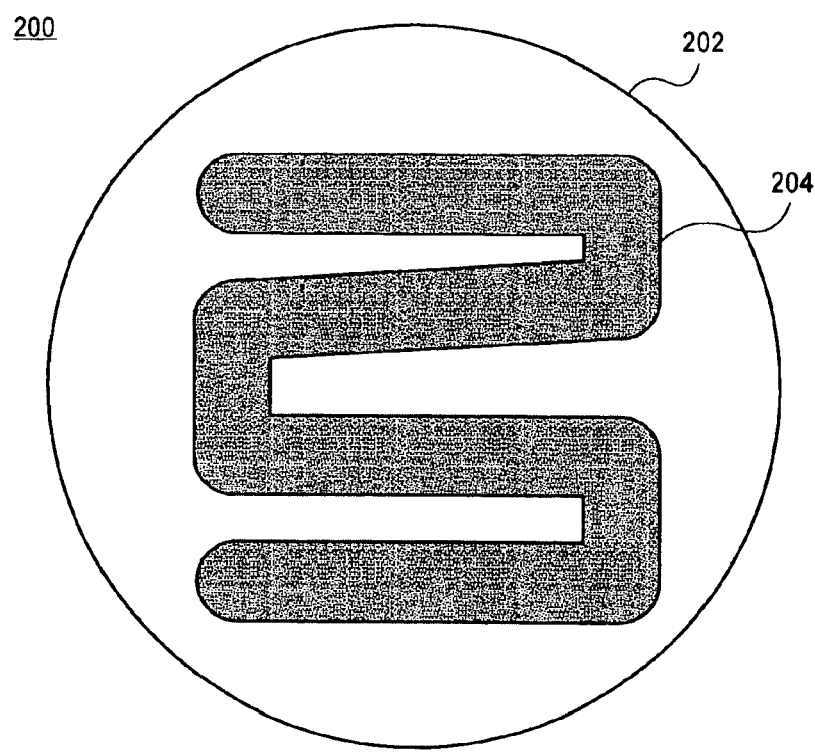
FIG. 2 illustrates an apparatus for facilitating separation of a mask and a mask platform, in accordance with another embodiment.

FIG. 2 illustrates an apparatus for facilitating separation of a mask and a mask platform, in accordance with another embodiment. Shown in FIG. 2, is a top view of an apparatus 200. The apparatus 200 includes a mask platform 202, and the mask platform 202 includes a channel 204 embedded within the mask platform 202. In the illustrated embodiment of FIG. 2, together, the apparatus 200 having the mask platform 202 and the channel 204, may operate as a temperature differential device. That is, a temperature differential device is integrated with the mask platform 202.

Continuing to refer to FIG. 2, in various embodiments, a predetermined holding force between a mask 102 (shown in FIG. 1) and the mask platform 202 may be released, as previously described. Once the predetermined holding force has been released, a temperature material may be provided through the channel 204, thereby providing a temperature differential between the mask (not shown) and the mask platform 202 having the channel 204, and which in turn, facilitates separation of the mask 102 (shown in FIG. 1) and the mask platform 204. The channel 204 may be coupled to a circulation device (not shown) to receive various materials having varying thermal properties to provide a thermal differential to the mask platform 202.

The material may be any type of temperature material such as, but not limited to a low temperature material (e.g., a gas and/or a liquid). Additionally, in the illustrated embodiment of FIG. 2, because the channel 204 may be fully enclosed within the mask platform 202, the material may be a wide variety of materials. The material provided within the channel 204 provides the thermal differential at the interface 106 between the mask 102 (both shown in FIG. 1) and the mask platform 202. That is, because the material may be fully enclosed, any material that provides a temperature differential to facilitate separation of the mask 102 (shown in FIG. 1) and the mask platform 202 may be utilized including various reactive materials. Additionally, as previously described, the material may be circulated through the channels 204 by a circulation device (not shown).

As previously described, the apparatus 200 may also be utilized in a EUV radiation lithography environment. Additionally, the apparatus 200 may include one or more electrodes 108 (shown in FIG. 1). It should be appreciated by those skilled in the relevant art that the manner in which the channel 204 may be disposed within the mask platform 202 may be based at least in part on the relative locations of the electrodes (shown in FIG. 1), and may be application dependent. Accordingly, the mask platform 202 may have more than one channel 204 in a variety of configurations.

Figure 3A:
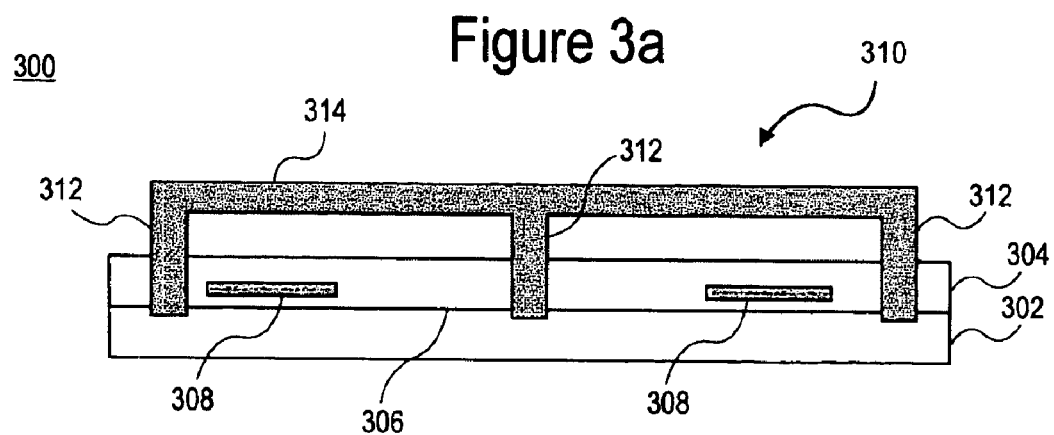
FIGS. 3a–3b illustrate various views of an apparatus for facilitating separation of a mask and a mask platform, in accordance with another embodiment.
Figure 3B:
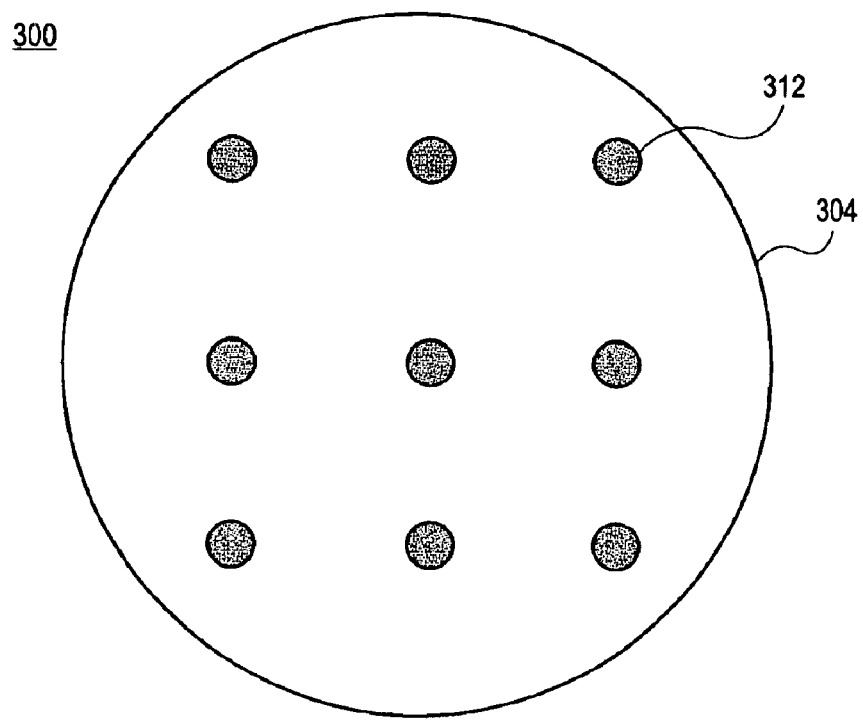

FIGS. 3a–3b illustrate various views of an apparatus for facilitating separation of a mask and a mask platform, in accordance with another embodiment. In FIG. 3a, a side view of an apparatus 300 is shown. The apparatus 300 includes a mask 302, a mask platform 304, and one or more electrodes 308. The mask 302, the mask platform 304, and the one or more electrodes 308 may be similar to the previously described in FIGS. 1–2. Accordingly, the one or more electrodes 308 may be disposed within the mask platform 304, and between the mask 302 and the mask platform 304 is an interface 306. However, in FIG. 3a, the mask platform 304 includes a thermal differential device 310 that is disposed to substantially penetrate through the mask platform 304.

Continuing to refer to FIG. 3a, in the illustrated embodiment, the thermal differential device 310 is shown as one or more pathways 312 that pass through the mask platform 304 and extends into the interface 306. Further, the one or more pathways 312 may be interconnected by a central connecting pathway 314. A material such as, but not limited to, a low temperature material may be provided through the connecting pathway 314, which in turn, provides the material to the one or more pathways 312. The material provided in the one or more pathways 312 provides a temperature differential between the mask 302 and the mask platform 304, thereby facilitating separation of the mask 302 and the mask platform 304. That is, the temperature differential is provided to the interface 306 aids in overcoming various surface tension affects that may be enhanced by various coatings to facilitate timely separation of the mask 302 and the mask platform 304.

Referring now to FIG. 3b, which is a view of the mask platform 304 from the mask 302 side, the one or more pathways 312 may be patterned on the mask platform 304 as shown. Here again, the patterning of the one or more pathways 312 may be based at least in part on the type and configuration of the mask platform 304. For example, the pattering of the one or more pathways 312 in FIG. 3b may be located to avoid one or more electrodes 308 (shown in FIG. 3a).

Figure 4:
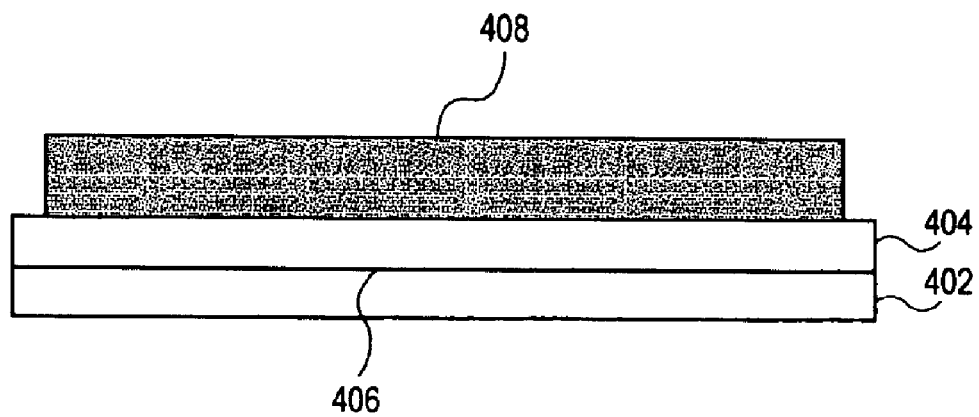
FIG. 4 illustrates an apparatus for facilitating separation of a mask and a mask platform, in accordance with another embodiment.

FIG. 4 illustrates an apparatus for facilitating separation of a mask and a mask platform, in accordance with another embodiment. Shown in FIG. 4 is a side view of an apparatus 400 that includes a mask 402, a mask platform 404, and an interface 406 between the mask 402 and the mask platform 404. On the mask platform 404 is shown a simplified view of a thermal differential device 408. In the embodiment illustrated in FIG. 4, the thermal differential device 408 may be a Peltier type of device. That is, a device that absorbs or produces heat based at least in part on the direction of electrical current. Accordingly, based at least in part on the electrical current provided to the thermal differential device 408, the thermal differential device 408 may provide a thermal differential to facilitate the separation of the mask 402 and the mask platform 404 (i.e., thermal differential to the interface 406). The electrical current may be provided by a variety of manners such as, but not limited to, an electrical current that may be provided to the one or more electrodes, previously described.

It should be appreciated by those skilled in the art that the apparatuses 100–300 illustrated in FIGS. 1–4 may be a portion thereof, and does not necessarily show the entire apparatuses utilized in lithography for manufacturing of integrated circuits such as, but not limited to semiconductor devices. Accordingly, in order to not obscure the various embodiments of the invention, various optical components, devices, and so forth have been omitted. Further, the apparatuses 100–400 may be utilized in a variety of lithography techniques. Accordingly, the mask and the mask platforms illustrated may be any shape and size and may be application dependent. Additionally, the material that provides a temperature differential may be any type of material and may be based at least in part on the material of the mask and/or the mask platform. That is, the temperature differential may be hot or cold and any combination thereof.

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Thus, it can be seen from the above descriptions, a novel method and apparatus to facilitate separation of a mask and mask platform has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. A method comprising:
   releasing a predetermined holding force between a mask and platform; and
   providing a temperature differential between the mask and the platform to facilitate separation of the mask and the platform.

2. The method of claim 1, wherein the predetermined holding force comprises an electrostatic force.

3. The method of claim 2, wherein the electrostatic force comprises a voltage differential.

4. The method of claim 1, wherein the mask and the platform comprises a mask and a mask platform compatible with extreme ultraviolet (EUV) radiation lithography.

5. The method of claim 4, wherein the EUV radiation lithography comprises a lithography method having wavelengths of radiation in a range of about 11–14 nanometers.

6. The method of claim 4, wherein the mask comprises a mask having a coating to facilitate substantial and stable holding forces.

7. The method of claim 6, wherein the coating comprises an electrically conductive coating.

8. The method of claim 7, wherein the electrically conductive coating comprises chromium (Cr).

9. The method of claim 1, wherein providing the temperature differential comprises providing a low temperature gas at an interface between the mask and the platform.

10. The method of claim 1, wherein providing the temperature differential comprises providing a current to a Peltier device included in the mask platform.

11. The method of claim 1, wherein providing the temperature differential comprises providing a material through one or more channels within the mask platform.

12. The method of claim 11, wherein the one or more channels comprises at least one of one or more channels fully enclosed within the mask platform.

13. The method of claim 1, wherein providing the temperature differential comprises providing a material through one or more pathways, the one or more pathways passing through the mask platform and extending into an interface between the mask and the mask platform.

14. The method of claim 1, wherein the mask comprises a reflective mask.

15. The method of claim 14, wherein the mask further comprises a mask having a silicon substrate upon which are multilayers of silicon and molybdenum.

16. An apparatus comprising:

a mask platform;

a mask coupled to the mask platform, the coupled mask and the mask platform forming an interface between the mask and the mask platform; and a temperature differential device, the temperature differential device disposed to provide a temperature differential at the interface to facilitate separation between the mask and the mask platform.

17. The apparatus of claim 16, wherein the mask platform comprises an electrostatic mask platform.

18. The apparatus of claim 16, wherein the mask platform comprises a mask platform compatible with extreme ultraviolet (EUV) radiation lithography.

19. The apparatus of claim 18, wherein the mask comprises a mask compatible with extreme ultraviolet (EUV) radiation lithography.

20. The apparatus of claim 19, wherein the mask comprises a mask having a coating to facilitate absorption of the EUV radiation.

21. The apparatus of claim 20, wherein the coating includes at least one of titanium nitride and tantalum nitride.

22. The apparatus of claim 19, wherein the mask comprises a mask having a coating to coating to facilitate substantial and stable holding forces.

23. The apparatus of claim 22, wherein the coating comprises an electrically conductive coating.

24. The apparatus of claim 23, wherein the electrically conductive coating comprises chromium (Cr).

25. The apparatus of claim 16, wherein the temperature differential device comprises a nozzle.

26. The apparatus of claim 16, wherein the temperature differential device comprises a Peltier device disposed on the mask platform.

27. The apparatus of claim 16, wherein the temperature differential device comprises one or more channels disposed within the mask platform.

28. The apparatus of claim 27, wherein the one or more channels comprises one or more channels fully enclosed within the mask platform.

29. The apparatus of claim 27, wherein the one or more channels comprises one or more channels coupled to a circulation device.

30. The apparatus of claim 16, wherein the temperature differential device comprises one or more pathways, the one or more pathways passing through the mask platform and extending into the interface.

31. The apparatus of claim 16, wherein the mask comprises a reflective mask.

32. The apparatus of claim 16, wherein the mask comprises a silicon substrate upon which are multilayers of silicon and molybdenum.

* * * * *